United States Patent

Huang et al.

Patent Number: 6,130,534
Date of Patent: Oct. 10, 2000

[54] METHOD OF CALIBRATING A THREE-AXIS MAGNETOMETER

[75] Inventors: Shih-Chu Huang, Kao Hsiung; Chung-Sung Tsay, Ping Tung; Heng-Shan Hsu, Kao Hsiung, all of Taiwan

[73] Assignee: Chung Shan Institute of Science and Technology, Tao Yuan, Taiwan

[21] Appl. No.: 09/037,347

[22] Filed: Mar. 10, 1998

[51] Int. Cl.$^7$ .......................... G01R 35/00; G01R 33/02; G01C 17/38; G01P 21/00; G06F 19/00
[52] U.S. Cl. .............................. 324/202; 324/247; 702/92
[58] Field of Search .................................... 324/202, 247, 324/244; 702/92, 94, 95; 33/356

[56] References Cited

U.S. PATENT DOCUMENTS 5,117,375  5/1992  Worcester et al. ........................ 702/92

Primary Examiner—Walter E. Snow
Attorney, Agent, or Firm—Rosenberg, Klein & Lee

[57] ABSTRACT

A method of calibrating a three-axis magnetometer is provided. In accordance with the method, calibration is effected by first establishing a three-axis magnetic field simulator having a center position portion. Suitable measures are taken to substantially compensate for the earth's magnetic field at least at that center position portion. A three-axis magnetometer is then disposed in the magnetic field simulator and successively actuated in predetermined manner to generate a set of measured parameter values. The measured parameter values are normalized using a predetermined standard output factor, and a square pre-calibration matrix C is generated from the normalized measured parameter values. An inverse matrix operation is thereafter performed upon the pre-calibration matrix C to generate a square calibration matrix D having a plurality of coefficients respectively indicative of orthonormal compensation coefficients. This square calibration matrix D is then applied to a subsequent measurement of the magnetometer to generate a corresponding compensated measurement.

15 Claims, 2 Drawing Sheets

METHOD OF CALIBRATING A THREE-AXIS MAGNETOMETER

FIELD OF THE INVENTION

The present invention relates to an orthonormal method of three-axes magnetometer A vector projection concept is utilized to obtain a set of 3×3 matrix data in the standard three-axes magnetic field simulator, and thereafter calculating the compensation coefficients to effect an orthonormal process for the pre-calibrated three-axes magnetometer using an inverse-matrix method. The compensation coefficients may be obtained via an analog electronic circuit or read from a table pre-stored in a storage device. more particularly, it will, in spite of the influence of mutual-coupling from the outputs of axes during adjusting orthonormal process of three-axial response output, it will allow you to complete all orthonormal processes simultaneously in order to reduce production costs.

DESCRIPTION OF PRIOR ART

In light of the applicable process for compact three-axes magnetometer, if there are errors from machinery, components, or while winding the wires of the coil, then the orthonormal process must be repeated with each axis one by one. During orthonormal process it will produce mutual-coupling from the outputs of axes and result in heavy and complicated work.

Furthermore, it will create a serious problem and produce heavy-coupling from the axial outputs on producing three-axes magnetometer if there are serious axial errors while adjusting the orthonormal process with each axis and result in a more difficult process; thus it is of utmost importance to reduce axial error to the greatest possible extent in production.

However, it is impossible to have no axial errors at all in producing a three-axes fluxgate magnetometer and thus the axes cannot be entirely orthonormal unless they are equipped with very precise machinery, components, and winding the wires of the coil accurately in order to align with axial directions correctly, there is no other way to reduce the axial errors completely. In view of the accurate alignment, more expenses and production costs will be incurred. In addition to three-axes fluxgate magnetometer, other three-axes magnetometers have the same problem of axial errors.

In light of this, there is still room for improvement in production as well as adjusting the orthonormal process of the three-axes magnetometer in order to offset drawbacks.

In view of the above, on which the inventor has focused and studied carefully and thoroughly on resolving the current problems with an available design and reasonable improvement.

SUMMARY OF THE INVENTION

It is the objective of this invention to provide an orthonormal method of three-axes magnetometer which is not only a unique method but also fully utilizes the concept of vector projection. We position the pre-calibrated three-axes magnetometer in following it's axial direction with care in the center of a standard three-axes magnetic simulator. Having Helmholtz coils, the magnetic field simulator can generate three standard magnetic fields in axial directions respectively, in order to measure a set of 3×3 matrix data, then after calculating the compensation coefficient on the orthonormal process of the pre-calibrated three-axes magnetometer by using an inverse-matrix method. The compensation coefficient can be achieved by analogue electronic circuit or look-up table with micro computer operation. Thus, it will be very easy to finish the orthonormal process of the three-axial directions simultaneously.

The second purpose of the invention is to provide an orthonormal technique of three-axes magnetometer which won't be influenced by mutual-coupling from the outputs of axes, thus it will be acceptable if there are various axial errors in production of the three-axes magnetometer. For a three-axes fluxgate magnetometer, this means the requirement of the machinery, components and also the accuracy for winding coils will be much more flexible and consequently, the cost of production will be significantly reduced making this as the major achievement of this invention.

BRIEF DESCRIPTION OF DRAWINGS

In order that the current invention can be understood more readily, the following description is given, by way of examples with reference to the accompanying drawings, in which.

The brief description of drawings.

Now, we will expound the orthonormal theory of this invention. First, an opposite-direction magnetic field is generated by Helmholtz coils for canceling the magnetic field of earth which occurs in the center position of a standard three-axes magnetic field simulator (hereinafter simply referred to as magnetic field simulator), then position an pre-calibrated three-axes magnetometer in the center of the magnetic field simulator and make the axial directions of X', Y', Z' parallel to the X,Y,Z directions of the magnetic field simulator as much as possible.

Generating a standard magnetic field with proper values on the axial directions of X, Y, and Z respectively, we can then get three voltage signals which correspond to the X', Y' and Z' output of the uncalibrated magnetometer in each standard magnetic field. Finally we can get nine output voltage signals, afterwards divided by the standard output voltage factor Vm (Vm is estimation value of an orthonormal three-axes magnetometer in standard magnetic field) and thereby the resulting values will be the coefficients of the 3×3 matrix C.

$$C_{11} = \frac{V_{xx'}}{V_m}, C_{12} = \frac{V_{yx'}}{V_m}, C_{13} = \frac{V_{zx'}}{V_m}$$

$$C_{21} = \frac{V_{xy'}}{V_m}, C_{22} = \frac{V_{yy'}}{V_m}, C_{23} = \frac{V_{zy'}}{V_m}$$

$$C_{31} = \frac{V_{xz'}}{V_m}, C_{32} = \frac{V_{yz'}}{V_m}, C_{33} = \frac{V_{zz'}}{V_m}$$

If, $(C_{11}^2+C_{12}^2+C_{13}^2)^{1/2}$ 1,$(C_{21}^2+C_{22}^2+C_{23}^2)^{1/2}$ 1 and $(C_{31}^2+C_{32}^2+C_{33}^2)^{1/2}$ 1 hence the sensitivity responses of X',Y', and Z' output of the uncalibrated magnetometer were not correct at all.

If, $C_{11}^2C_{21}^2+C_{12}^2C_{22}^2+C_{13}^2C_{23}^2$ 0 hence the X', and Y' axes of the pre-calibrated magnetometer are not orthogonal. And if $C_{11}^2C_{31}^2+C_{12}^2C_{32}^2+C_{13}^2C_{33}^2$ 0 then the Y', and Z' axes are not orthogonal.

And if $C_{21}{}^2C_{31}{}^2+C_{22}{}^2C_{32}{}^2+C_{23}{}^2C_{33}{}^2$ 0 hence the Y', and Z' axes are not orthogonal.

And after reasoning by mathematical methods, if the inverse matrix of 3×3 matrix C is $C^{-1}$ and also it makes matrix $D=C^{-1}$ thereby it will result in a relationship of orthonormal output of the pre-calibrated magnetometer are:

$$\begin{bmatrix} V_x \\ V_y \\ V_z \end{bmatrix} = \begin{bmatrix} D_{11} & D_{12} & D_{13} \\ D_{21} & D_{22} & D_{23} \\ D_{31} & D_{32} & D_{33} \end{bmatrix} \begin{bmatrix} V_{x'} \\ V_{y'} \\ V_{z'} \end{bmatrix}$$

In this formula, Vx', Vy', Vz' represent the output of the pre-calibrated three-axes magnetometer, and Vx, Vy, Vz represent the output of the post-calibrated three-axes magnetometer which are orthonormal. And the 9 coefficients in matrix D are the orthonormal compensation coefficients of the pre-calibrated three-axes magnetometer.

The compensation coefficients can be achieved by analog electronic circuit or look-up table with microcomputer operation, and it will be very easy to finish the orthonormal process of three axial directions simultaneously.

Figure 1:
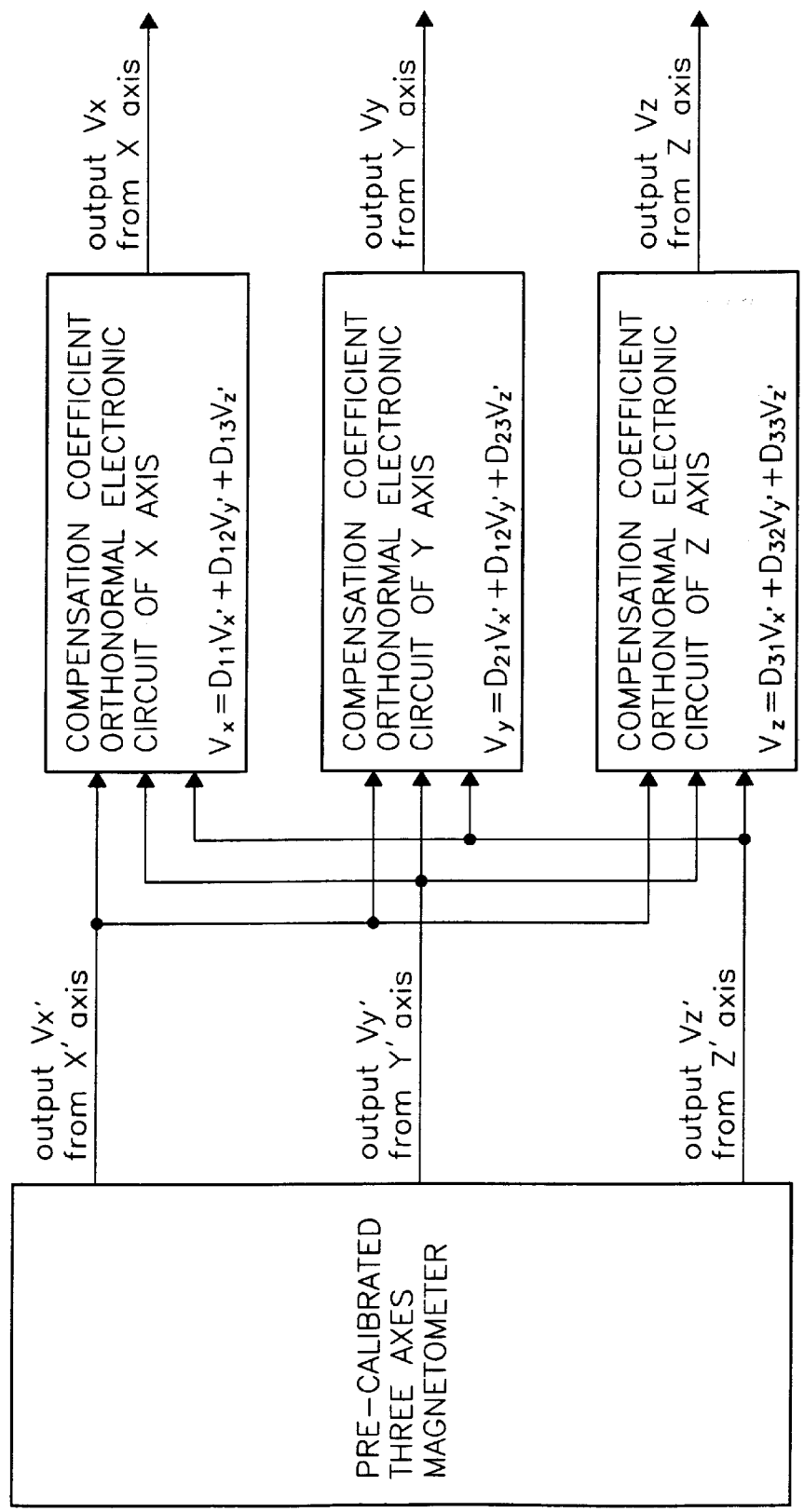
FIG. 1 is a block diagram using an analogue electronic circuit to achieve orthonormal compensation of the three-axes magnetometer.

FIG. 1 is a block diagram of an analog electronic circuit to finish orthonormal compensation of the three-axes magnetometer. The output Vx', Vy', Vz' of X',Y',Z', from an pre-calibrated three-axes magnetometer which passed through the X axis', Y axis' and Z axis' orthonormal compensation electronic circuits respectively, then we can get the output Vx, Vy, Vz of the post-calibrated three-axes magnetometer with the orthonormal process:

$Vx=D_{11}V_{x'}+D_{12}V_{y'}+D_{13}V_{z'}$ $Vy=D_{21}V_{x'}+D_{13}V_{y'}+D_{33}V_{z'}$ $Vz=D_{31}V_{x'}+D_{32}V_{y'}+D_{33}V_{z'}$

Figure 2:
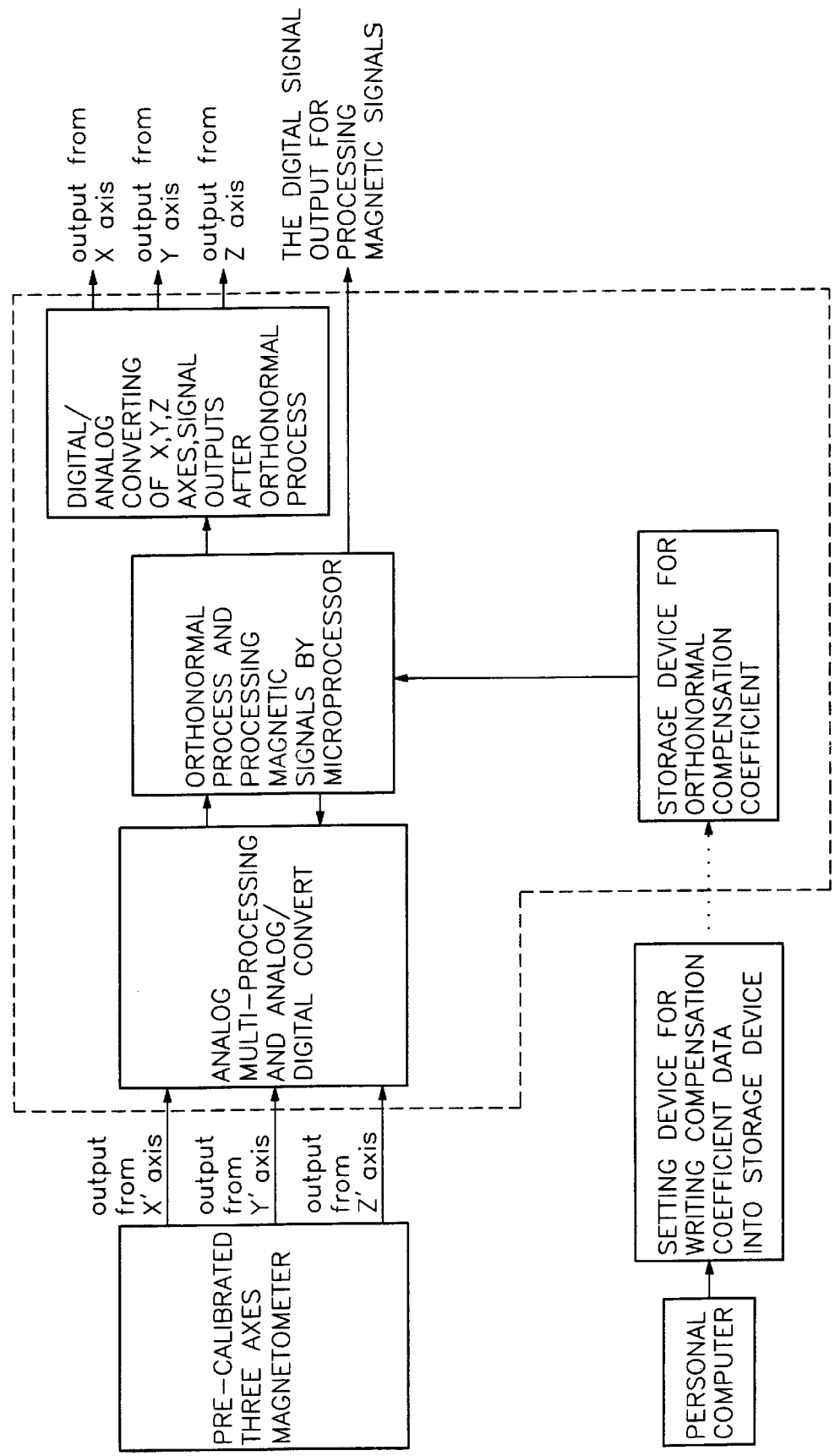
FIG. 2 is a block diagram using a micro computer to achieve orthonormal compensation of the three-axes magnetometer.

FIG. 2 is a block diagram of a microcomputer to finish orthonormal compensation of the three-axes magnetometer. To utilize the setting up device to access the compensation coefficient of the magnetometer into a storage device. The output of X',Y',Z', from a pre-calibrated three-axes magnetometer which pass through an analog/digital converter to be transformed into digital signals. The microprocessor reads compensation coefficients from the pre-stored table and multiplies them with the X', Y', Z' digital data to process orthonormal compensation. Then pass through a digital/analog converter so as to get the output of X,Y,Z, axes of the post-calibrated magnetometer. Moreover the microprocessor can also complete the digital signal processing of three axes magnetic field signal (such as calculating the absolute values of the magnetic field) simultaneously and thus can obtain the digital output of the magnetic signal processing result.

The advantages of utilizing the look-up table method to achieve the orthonormal process are:

(1) Replacing analog electronic circuits to keep away the precise adjustment on circuits which wastes much time.

(2) It can be connected via a proper interface with a personal computer to access the orthonormal compensation coefficient into the parameter table. It is very valuable for speedy mass production and with low costs as well.

(3) Apart from outputting the analog magnetic field from X,Y,Z, axes after orthonormal compensation, in the meantime, it also can use the microprocessor working on the digital signal processing of the magnetic field vector to simplify the system in processing the magnetic signals.

From the aforesaid description, the features of this invention are:

(1) To significantly save time and money, because it is very convenient to use the automatic programming testing method plus calculating an inverse matrix to find out the orthonormal compensation coefficient of three-axes magnetometer.

(2) On obtaining the orthonormal compensation coefficient of three-axes magnetometer, it is available to utilize analog electronic circuits to finish the orthonormal process of three axial directions simultaneously. This is a great improvement from the conventional calibrated technique of three-axes magnetometer which can only do the adjustment one axis at a time. The conventional calibrated technique is a complicated procedure because of the mutual-coupling from axes' outputs. It can also utilize the look-up table with microprocessor operation to finish the orthonormal process of three axial directions simultaneously. The last method is very valuable for speedy mass production with low costs.

(3) The process of the invention for the orthonormal method of the three-axes magnetometer which won't be influenced by mutual-coupling from the outputs of axes. Thus it will be acceptable if there are various axial errors on production of the three-axes fluxgate magnetometer and it means the requirement of the machinery, components and also the accuracy for winding coils will be much more flexible and consequently, production costs will be significantly lower.

While particular embodiment of this invention has been illustrated and described, it would be obvious to those skilled in the art that various other changes and modifications can be made without departing from the spirit and scope of the invention.

It is therefore intended to cover in the appended claims all such changes and modifications that are within the scope of the present invention.

What is claimed is:

1. A method of calibrating a three-axis magnetometer comprising the steps of:

(a) establishing a three-axis magnetic field simulator having a center position portion;

(b) substantially compensating for the earth's magnetic field at least at said center position portion of said magnetic field simulator;

(c) disposing a three-axis magnetometer in said magnetic field simulator;

(d) successively actuating said magnetic field simulator in predetermined manner and measuring a corresponding output signal for each axis of said three-axis magnetometer to generate a set of measured parameter values;

(e) normalizing said measured parameter values by dividing each said measured parameter value by a predetermined standard output factor;

(f) generating a square pre-calibration matrix C having coefficients respectively formed by said normalized measured parameter values;

(g) performing an inverse matrix operation on said pre-calibration matrix C to generate a square calibration matrix D having a plurality of coefficients respectively indicative of orthonormal compensation coefficients for compensating a subsequent three-axis measurement of said magnetometer;

(h) applying said square calibration matrix D to said subsequent measurement of said magnetometer to generate a compensated measurement corresponding thereto.

2. The method of calibrating a three-axis magnetometer as recited in claim 1 wherein said step (h) includes combining said calibration matrix D with said subsequent three-axis measurement of said magnetometer by matrix multiplication.

3. The method of calibrating a three-axis magnetometer as recited in claim 2 wherein said compensated measurement generated at step (h) includes a plurality of axial measurements each formed by linearly combining a predetermined subset of said calibration matrix D coefficients with said subsequent three-axis measurement of said magnetometer.

4. The method of calibrating a three-axis magnetometer as recited in claim 3 wherein each of said pre-calibration and calibration matrices C and D is a 3×3 matrix.

5. The method of calibrating a three-axis magnetometer as recited in claim 1 wherein step (c) includes positioning said magnetometer in substantially concentric manner at said center position portion of said magnetic field simulator.

6. The method of calibrating a three-axis magnetometer as recited in claim 1 wherein step (c) includes positioning said magnetometer in said magnetic field simulator substantially in axially aligned manner.

7. The method of calibrating a three-axis magnetometer as recited in claim 1 wherein said measured parameter values and said standard output factor are each voltage values, said standard output factor being a predetermined voltage value $V_m$.

8. The method of calibrating a three-axis magnetometer as recited in claim 1 wherein said calibration matrix D is inversely related to said pre-calibration matrix C.

9. The method of calibrating a three-axis magnetometer as recited in claim 1 wherein step (h) includes establishing an analog electronic circuit and passing said subsequent three-axis measurement of said magnetometer thereto, said analog electronic circuit responsively generating said corresponding compensated measurement.

10. The method of calibrating a three-axis magnetometer as recited in claim 1 wherein step (h) includes establishing a set of pre-stored parameters containing said calibration matrix D coefficients and a microprocessor for automatically reading said coefficients therefrom for said application to said subsequent three-axis measurement of said magnetometer.

11. The method of calibrating a three-axis magnetometer as recited in claim 10 wherein step (h) further includes storing said pre-stored parameters in an electronic storage device.

12. The method of calibrating a three-axis magnetometer as recited in claim 11 wherein step (h) further includes establishing means controlled by said microprocessor for writing said pre-stored parameters in said storage device.

13. The method of calibrating a three-axis magnetometer as recited in claim 10 wherein step (h) is preceded by the step of performing analog/digital conversion of said subsequent three-axis measurement of said magnetometer.

14. The method of calibrating a three-axis magnetometer as recited in claim 13 wherein step (h) is followed by the step of performing digital/analog conversion of said compensated measurement corresponding to said subsequent three-axis measurement of said magnetometer.

15. The method of calibrating a three-axis magnetometer as recited in claim 1 wherein step (d) includes actuating said magnetic field generator to successively generate a predetermined standard magnetic field component for each of said axes thereof and measuring said output signals for said three axes of said magnetometer responsive to each said predetermined standard magnetic field component generation.

\* \* \* \* \*